United States Patent [19]
Hashimoto et al.

[11] Patent Number: 6,144,260
[45] Date of Patent: *Nov. 7, 2000

[54] AMPLIFIER

[75] Inventors: Koji Hashimoto, Hyogo; Yoshikuni Fujihashi, Osaka; Hiroshi Takahashi, Osaka; Kazuhiro Yahata, Osaka, all of Japan

[73] Assignee: Matsushita Electric Industrial Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/973,600

[22] PCT Filed: Jun. 7, 1996

[86] PCT No.: PCT/JP96/01564

§ 371 Date: Mar. 23, 1998

§ 102(e) Date: Mar. 23, 1998

[87] PCT Pub. No.: WO96/42134

PCT Pub. Date: Dec. 27, 1996

[30] Foreign Application Priority Data

Jun. 9, 1995 [JP] Japan ..................... 7-143275
Dec. 25, 1995 [JP] Japan ..................... 7-336487

[51] Int. Cl.⁷ ........................................ H03F 3/191
[52] U.S. Cl. ............................... 330/306; 330/68
[58] Field of Search ................. 330/53, 65, 66, 330/67, 68, 286, 302, 306, 307, 310

[56] References Cited

U.S. PATENT DOCUMENTS 5,805,023 9/1998 Fukuden ..................... 330/302

FOREIGN PATENT DOCUMENTS 4-301901 10/1992 Japan .
4-306922 10/1992 Japan .
5-175777 7/1993 Japan .

Primary Examiner—Steven J. Mottola
Attorney, Agent, or Firm—Rossi & Associates

[57] ABSTRACT

The present invention relates to an amplifier comprising a first amplification circuit (1) formed of a first transistor (10) and a second amplification circuit (2) formed of a second transistor (11), wherein a first filter (3) having a desired pass-band and a desired attenuation band is connected between the output section of the foregoing first amplification circuit (1) and the input section of the foregoing second amplification circuit (2), thereby reducing noises in the output.

29 Claims, 14 Drawing Sheets

AMPLIFIER

TECHNICAL FIELD

The present invention relates to an amplifier for use in wireless communication equipment such as a transmitter of portable telephone, for example.

BACKGROUND ARTS

In general, an amplifier for communication equipment is required to have high efficiency and it is known that a matching circuit is used to achieve high efficiencies of an amplifier as disclosed in a Japanese Published Unexamined Patent Application of No. 32335/95. When signals are amplified by an amplifier, such undesired signal components as noise and the like that exist outside the frequencies intended for Amplification are also amplified at the same time. Because of this, a filter is connected to the output side of an amplifier to attenuate undesired signal components such as noise and the like.

One of the problems involved with the foregoing system has been that attenuation of the noise amplified by an amplifier and additional noises has to be achieved by a filter alone situated behind the amplifier in the system, thereby requiring the filter to have large attenuation by using many resonators resulting in a bulky filter. In addition, the loss in a pass-band of the filter connected behind the amplifier tends to increase, thus requiring the amplifier to output more power with resultant hindrance to the efficiency improvement of the amplifier.

More specifically, the relations involved with band-pass filter attenuation vs. frequency characteristics, frequency spacings in transmitting signals and receiving signals, and the like will be explained with reference to FIG. 14. FIG. 14 shows a case wherein a receiving signal band is located in a higher frequency band than a transmitting signal band. In general, with portable telephones, a plurality of both transmitting signal frequencies and receiving signal frequencies are prepared within a given frequency band, thereby communications being performed between transmitting signals and receiving signals through a step of selecting a pair of frequencies, the frequency spacing of which maintains a constant value. Also, signals that have passed a filter behind an amplifier are needed to suppress undesired signal components such as noise and the like existing in the receiving signal frequencies in order to prevent a reduction in receiving sensitivity caused by an infiltration of undesired signals into a receiving section. The general characteristics required of a filter that satisfies the foregoing requirement are to have a small amount of attenuation in the transmitting frequency band and a large amount of attenuation in the receiving frequency band, and to make the attenuation in the transmitting frequency band stay lower than the tolerated attenuation level of the transmitting signal at the highest frequency and the attenuation in the receiving frequency band maintain the needed attenuation of the receiving signal at the lowest frequency. As a result, the filter characteristics are required to have a large amount of attenuation change for frequency changes, thereby causing, in general, the filter characteristics to show large attenuation in transmitting signals and reduced amplification efficiencies.

DISCLOSURE OF THE INVENTION

The object of the present invention is to reduce noises outputted from an amplifier, thereby allowing a filter connected behind the amplifier to have less steep attenuation characteristics and at the same time improving efficiencies of the amplifier.

In order to achieve the foregoing object, an amplifier of the present invention comprises a first filter, which is connected between the output section of a first amplification circuit and the input section of a second amplification circuit, has specified pass band and a specified attenuation band and show different values between input impedance and output impedance.

According to the structure as described in the above, the signals intended for amplification and outputted from the first amplification circuit are inputted to the second amplification circuit almost without any attenuation while the noises outputted from the first amplification circuit being inputted to the second amplification circuit after attenuation by the first filter. Thus, a very little amount of noises is outputted from the second amplification circuit.

PREFERRED EMBODIMENTS OF THE INVENTION

Figure 1:
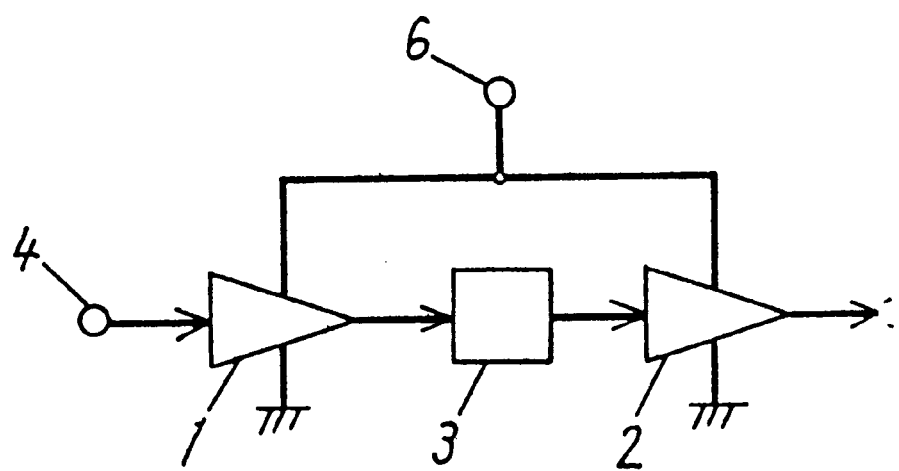
FIG. 1 is a circuit block diagram of an amplifier in an exemplary embodiment of the present invention.

FIG. 1 is a circuit block diagram of an amplifier in an exemplary embodiment of the present invention.

In FIG. 1, the reference numeral 1 shows a first amplification circuit, the output of which is connected to a first filter 3. Further, the output of the first filter 3 is connected to a second amplification circuit 2. A power supply terminal 6 is connected to the first amplification circuit 1 and second amplification circuit 2, an input terminal 4 is connected to the input of the first amplification circuit 1 and an output terminal 5 is connected to the output of the second amplification circuit 2.

Figure 2:
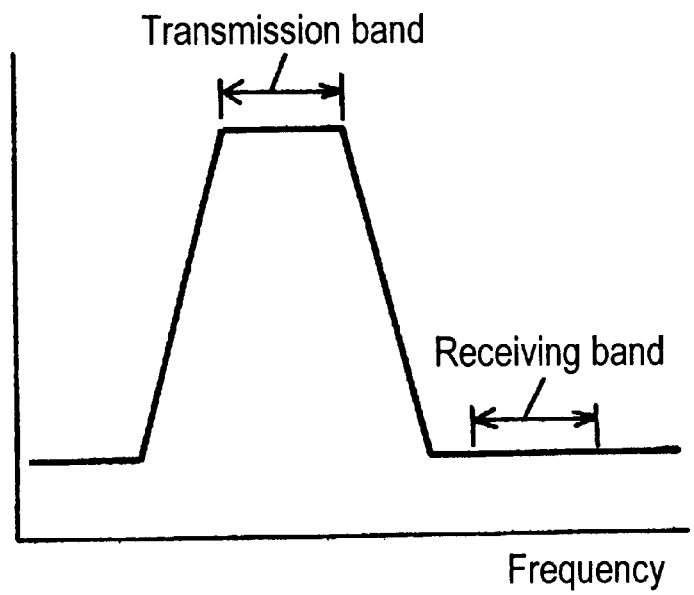
FIG. 2 shows characteristics of a filter of the foregoing amplifier.

According to the structure as described in the above, signals inputted in the input terminal 4 are amplified at the first amplification circuit 1 and then inputted to the first filter 3. At the same time, noises inputted from the input terminal 4 are amplified at the first amplification circuit 1 and inputted to the first filter 3. In addition, noises produced inside of the first amplification circuit 1 are also inputted to the first filter 3. In other words, noises having a high level are outputted from the first amplification circuit 1. However, when the first filter 3 is a band-pass filter as shown in FIG. 2, the signals amplified at the first amplification circuit 1 (located in the transmission band) are outputted with little attenuation while the noises (located in the receiving band) are attenuated greatly. As a result, signals of a high level and noises of only a minute level are outputted from the second amplification circuit 2 to the output terminal 5. Also, in the present exemplary embodiment, the loss in the transmission band of the first filter 3 can be sufficiently compensated by an improvement in amplification factor of the first amplification circuit 1. Efficiencies of the amplifier are rather enhanced since the output power of the second amplification circuit 2 can be reduced because of a reduction of the loss in the transmission band caused by mitigation of the amount of attenuation in noise required of the filter that is connected behind the second amplification circuit 2. By the use of an amplifier of the present exemplary embodiment as the amplifier in the transmission side of wireless communication equipment, power consumption can be reduced greatly.

Figure 3:
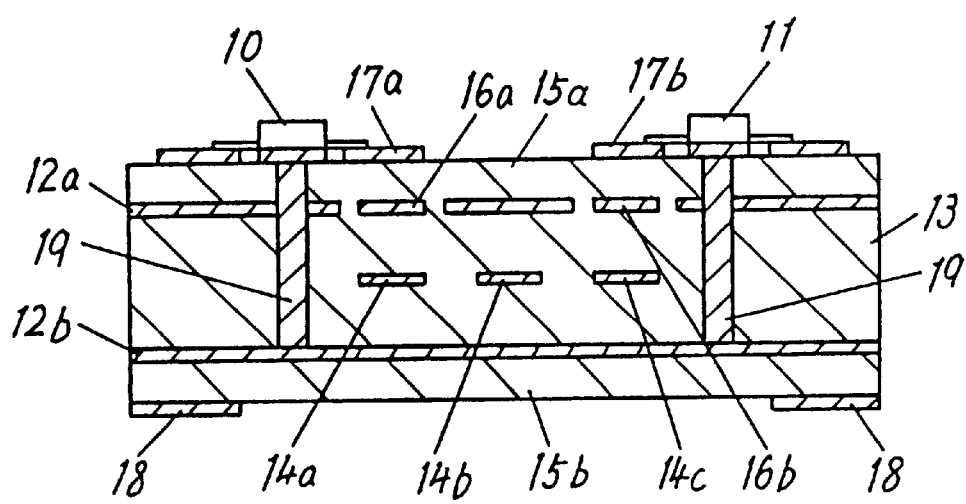
FIG. 3 is a cross-sectional view of a specific structure of the foregoing amplifier.

FIG. 3 is a cross-sectional view of a specific structure of an amplifier of the present invention.

In FIG. 3, the reference numerals 10 and 11 are a first transistor and second transistor that form a first amplification circuit 1 and second amplification circuit 2, respectively. Electrode patterns 14a to 14c are disposed inside of a dielectric 13 and sandwiched between ground electrodes 12a and 12b. A dielectric 15a is laid on top of the ground electrode 12a, and further on top of the dielectric 15a electrode patterns are formed and the first transistor 10 and second transistor 11 are mounted, thus the first amplification circuit 1 and second amplification circuit 2 are constructed. In addition, a dielectric 15b is laid on the bottom surface of the ground electrode 12b and further an electrode pattern is formed on the surface of the dielectric 15b, thus providing a terminal electrode 18. Electrode patterns 16a and 16b are situated opposite to part of the electrode pattern 14a or the electrode pattern 14c with the dielectric 13 placed in between. Electrode patterns 17a and 17b are situated opposite to the electrode pattern 16a and 16b with the dielectric 15a placed in between, respectively. The electrode pattern 17a is connected with the output terminal of the first transistor 10 and the electrode pattern 17b is connected with the input terminal of the second transistor 11. Through holes 19 are connected with the ground terminals of the first transistor 10 and second transistor 11 and also with the ground electrodes 12a and 12b.

According to the structure as described in the above, the first filter 3 is formed of the electrode patterns 14a to 14c, the dielectric 13 aid the ground electrodes 12a and 12b, as shown in FIG. 2. The output terminal of the first transistor 10 is coupled with the first filter 3 by the capacitance formed between the opposing electrode patterns 14a, 16a and 17a. Also, the input terminal of the second transistor 11 is coupled with the first filter 3 by the capacitance formed between the opposing electrode patterns 14c, 16b and 17b in the same manner as above. Thus, a circuit block as shown in FIG. 1 can be constructed and a filter can be miniaturized by employing a multi-layer structure as in the present exemplary embodiment. Also, heat dissipation can be improved by having the ground terminals of the first transistor 10 and second transistor 11 connected with the ground electrodes 12a and 12b by means of the through holes 19. In addition, it is preferred that the dielectric constant of the dielectric 13 is not less than 10 for miniaturization of the filter and the dielectric constant of the dielectrics 15a and 16b does not exceed 10 for easier construction of circuits. In case where the structure in the present exemplary embodiment is formed by use of multi-layered green sheets and a batch sintering process, the dielectrics 15a and 15b are to be formed of the same material and to the same thickness so that the sintering may be performed without causing any danger of warping.

Figure 4:
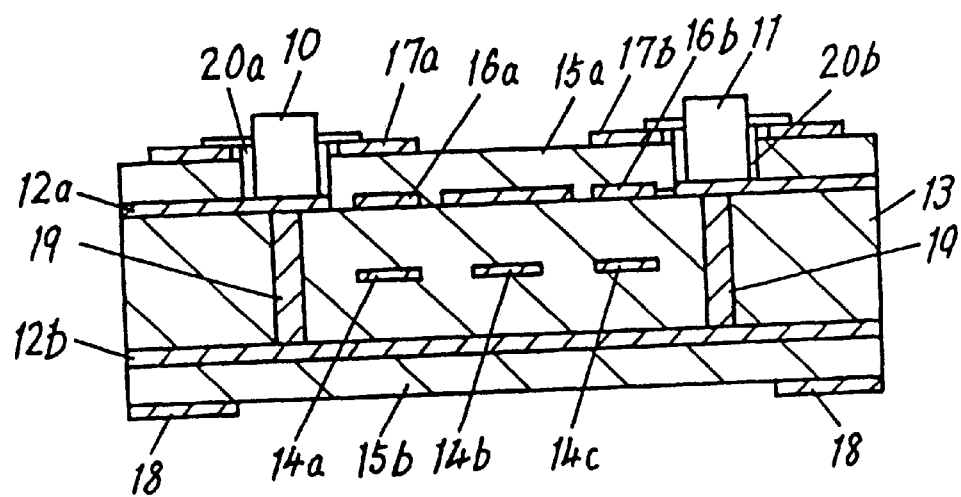
FIG. 4 is a cross-sectional view of an amplifier in another exemplary embodiment of the present invention.

FIG. 4 is a cross-sectional view of an amplifier in another exemplary embodiment of the present invention.

In FIG. 4, the reference symbols 20a and 20b are recesses formed by running through part of the dielectric 15a. The first and second transistors 10 and 11 are mounted inside of the recesses 20a and 20b, respectively, and the ground terminals thereof are directly connected to the ground electrode 12a, thereby contributing further to an increase in heat dissipation.

Furthermore, in FIG. 3 and FIG. 4, the same effect as above can be gained by connecting one of the spacings selected from the ones between the electrode patterns 14a and 16a and between the electrode patterns 16a and 17a by a via hole and leaving the remaining spacing to form capacitance. Similarly, the same can be achieved by connecting one of the spacings selected from the ones between the electrode patterns 14c and 16b and between the electrode patterns 16b and 17b by a via hole and leaving the remaining spacing to form capacitance in FIG. 3 and FIG. 4.

Figure 5:
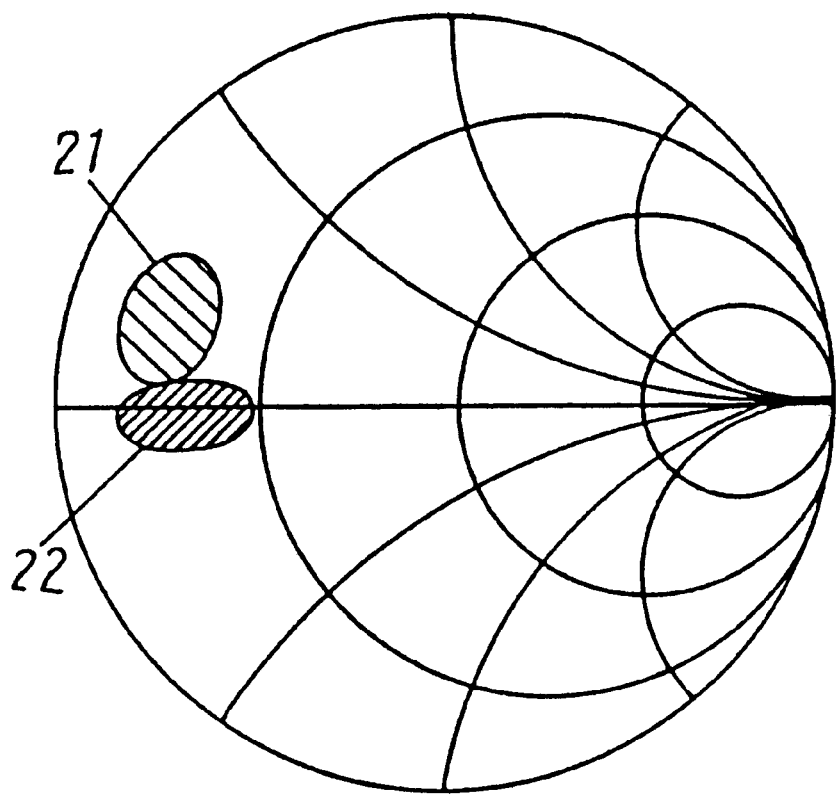
FIG. 5 shows impedance characteristics of the foregoing amplifier.

FIG. 5 is a diagram to show input and output impedance of the first filter 3 in FIG. 1.

In FIG. 5, the reference numeral 21 shows a domain of input and output impedance for the first transistor 10 or the second transistor 11, and the reference numeral 22 is a domain of input and output impedance for the first filter 3. Since a transistor used in an amplifier at the transmission side of communication equipment outputs a large power, the input and output impedance thereof is low as indicated in FIG. 5. Therefore, the loss incurred by coils and capacitors that are usually used in a matching circuit can be eliminated, thereby improving efficiencies by making the input and output impedance of the first filter 3 employed in the present invention not 50 ohms but a value between ½ and 2 times the real part of the output impedance of the first transistor 10 or the input impedance of the second transistor 11 and also by connecting the first transistor 10 and second transistor 11 directly with the first filter 3. In other words, when the input and output impedance of the first transistor 10 and second transistor 11 falls in the domain 21 of FIG. 5, it is preferred that the input and output impedance of the first filter 3 is made to fall in the domain 22 of FIG. 5. Also, when the first filter 3 is structured according to FIG. 3 and FIG. 4 and connected with the first transistor 10 and second transistor 11, the input and output impedance of the first filter 3 can be made a complex conjugate of the first transistor 10 and second transistor 11 depending on the opposing areas between the electrode patterns 14 and 16 and between the electrode patterns 16 and 17. Further, the input and output impedance of the first filter 3 can be set up independently according to the impedance of each respective amplification circuit connected thereto.

Figure 6:
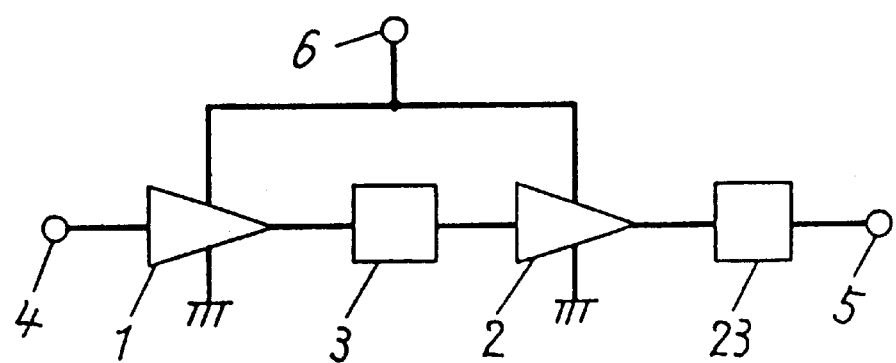
FIG. 6 is a circuit block diagram of an amplifier in another exemplified embodiment of the present invention.
Figure 7:
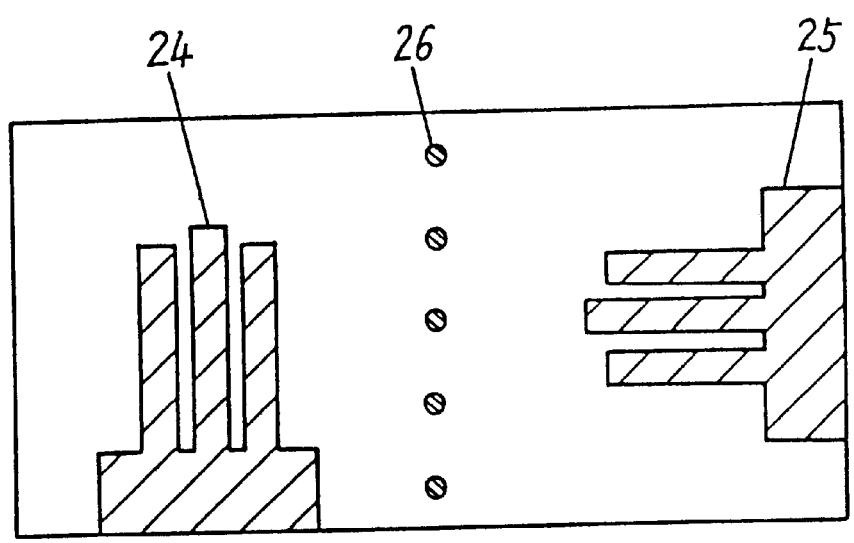
FIG. 7 is a pattern diagram of one of the filters for the foregoing amplifier.

FIG. 6 is a circuit block diagram of an amplifier in another exemplified embodiment of the present invention and FIG. 7 shows how the foregoing circuit block is structured.

In FIG. 6, the reference numeral 23 is a second filter connected between the output of the second amplification circuit 2 and the output terminal 5. In FIG. 7, the reference numerals 24 and 25 are electrode patterns formed inside of the dielectric 13 as shown in FIG. 3 and FIG. 4. The reference numeral 26 shows through holes connected between the ground electrodes 12a and 12b.

In the structure as described in the above, the second filter 23 hardly attenuates the desired signals outputted from the second amplification circuit 2 and attenuates noises, instead. Since the input impedance of the second filter 23 is set to ½ to 2 times the real part of the output impedance of the second transistor 11, the second filter 23 can be connected directly with the second transistor 11. As a result, efficiencies of the second amplification circuit 2 can be enhanced. In addition, when the first filter 3 and second filter 23 are formed of strip lines that compose the electrode patterns 24 and 25 in one plane of a laminated structure as shown in FIG. 7, coupling between the-electrode patterns 24 and 25 can be prevented from taking place by providing the through holes 26, which are connected with the ground electrodes 12a and 12b, between the electrode patterns 24 and 25. In that case, the aforementioned coupling can be extremely reduced by making the spacing between the through holes 26 shorter than the length of the shortest line in the electrode patterns 24 and 25. Furthermore, the coupling between the electrode patterns 24 and 25 can be further reduced by arranging the electrode patterns 24 and 25 in a position perpendicular to each other.

Figure 8:
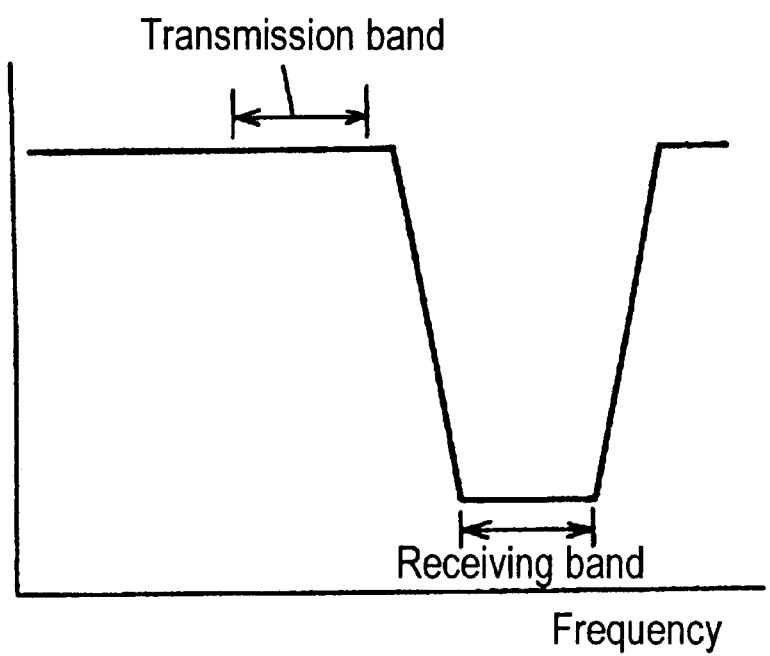
FIG. 8 shows characteristics of another filter used in the foregoing amplifier.

Further, the characteristics of the first filter 3 and second filter 23 can incorporate the characteristics of a bandpass filter whereby signals of communication equipment in a transmission band are passed and signals in a receiving band are attenuated as shown in FIG. 2, and also can incorporate the characteristics of a band rejection filter and the like whereby signals in a receiving band are attenuated as shown in FIG. 8.

It is also possible to attach to the amplifier a function that allows the amplifier to be used as a monitor for power controlling by integrating in one piece with the amplifier a directional coupler that utilizes a two parallel wire transmission line of a laminated structure, thereby allowing power to be taken out of a desired position of the amplifier.

FIG. 9 is a circuit block diagram of an amplifier in still another exemplary embodiment of the present invention, wherein the reference numeral 31 is a first amplification circuit, the reference numeral 32 is a second amplification circuit, the reference numeral 33 is a frequency variable filter, the reference numeral 34 is a computing circuit, the reference numeral 35 is a voltage controlled oscillator, the reference numeral 36 is an input terminal and the reference numeral 37 is an output terminal.

Transmission signals are inputted into the input terminal 36, amplified in the first amplification circuit 31 and second amplification circuit 32 and pass through the frequency variable filter 33, thereby such undesired signals as noises and the like that exist in the receiving signal frequencies being suppressed, and are outputted through the output terminal 37. Frequency characteristics of the frequency variable filter 33 are controlled by a control voltage produced by processing in the computing circuit 34 an input frequency control voltage of the voltage controlled oscillator 35 which is inputted into the computing circuit 34. The frequency variable filter 33 is directly connected to the output section of the second amplification circuit 32, and in the same way as described in FIG. 1 the input impedance of the frequency variable filter 33 is adjusted to match with the output impedance of the second amplification circuit 32 and differs from the output impedance of the frequency variable filter 33.

Figure 10:
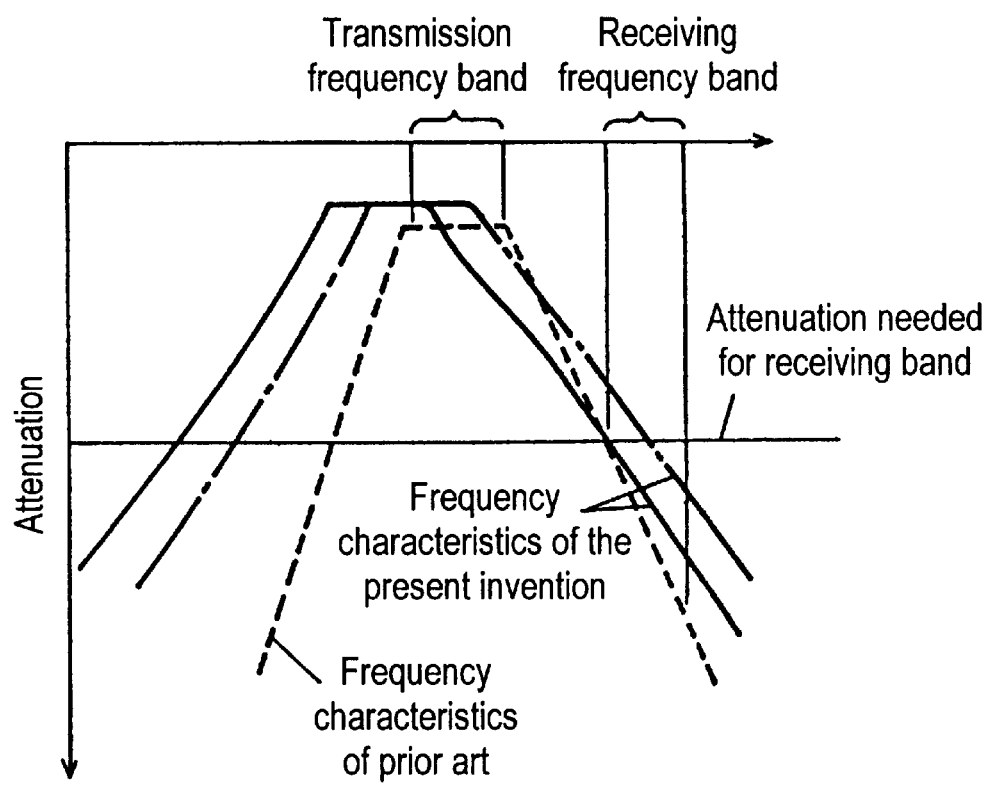
FIG. 10 shows frequency characteristics of a frequency variable filter used in the foregoing amplifier.

FIG. 10 shows frequency characteristics of the frequency variable filter 33 In terms of attenuation vs. frequency. A solid line shows a case wherein transmission signals have the lowest frequency in the frequency band, and a dash and dotted line shows a case wherein transmission signals have the highest frequency in the frequency band. A dotted line shows attenuation vs. frequency characteristics of a prior art filter wherein frequency characteristics are not variable. In all the cases as described in FIG. 10, the receiving signals have a higher frequency than the transmission signals and the transmission frequency signals have the lowest frequency in the transmission frequency band.

When the frequency variable filter 33 is connected to the output side of the second amplification circuit 32 as in the present exemplary embodiment, it suffices that only the signals with frequencies used in transmission are suppressed below the tolerated attenuation level and, according to the changes in transmission frequency, filter's frequency characteristics are changed to match with transmission signals. Therefore, the frequency characteristics of filter's attenuation are allowed to have a smaller degree of changes in attenuation against frequency changes, resulting in a reduction of attenuation at the transmission section and an increase in amplification efficiencies. Accordingly, a high efficiency band-pass amplifier can be realized.

Figure 9A:
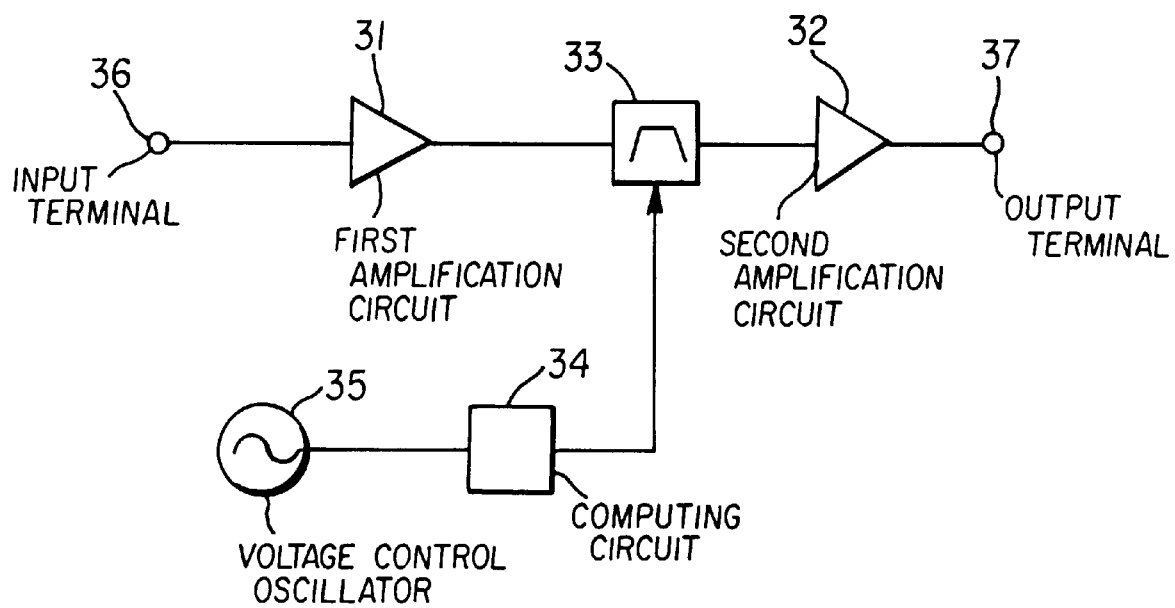
FIG. 9 is a circuit block diagram of an amplifier in still another exemplary embodiment of the present invention.

Although the present exemplary embodiment deals with a case wherein the amplification circuit 32 is connected to the input side of the frequency variable filter 33, the same effect can be obtained by connecting the amplification circuit 32 to the output side of the frequency variable filter 33 as shown in FIG. 9A. The frequency variable filter 33 is directly connected to the input section of the first amplification circuit 31 and also the output section of the second amplification circuit 32, and in the same way as described in FIG. 1 the input impedance of the frequency variable filter 33 is adjusted to match with the output impedance of the first amplification circuit 31 and the output impedance of the frequency variable filter 33 is made to match with the input impedance of the second amplification circuit 32, thereby making the input impedance and output impedance of the frequency variable filter 33 different from each other. In this case, it is needless to say that by connecting a second frequency variable filter directly to the output of the second amplification circuit 32 in the same way as in FIG. 6, efficiencies of the second amplification circuit 32 can be improved. At this time, in the same way as described in FIG. 6 the input impedance of the second frequency variable filter is adjusted to match with the output impedance of the second amplification circuit 32.

Figure 11:
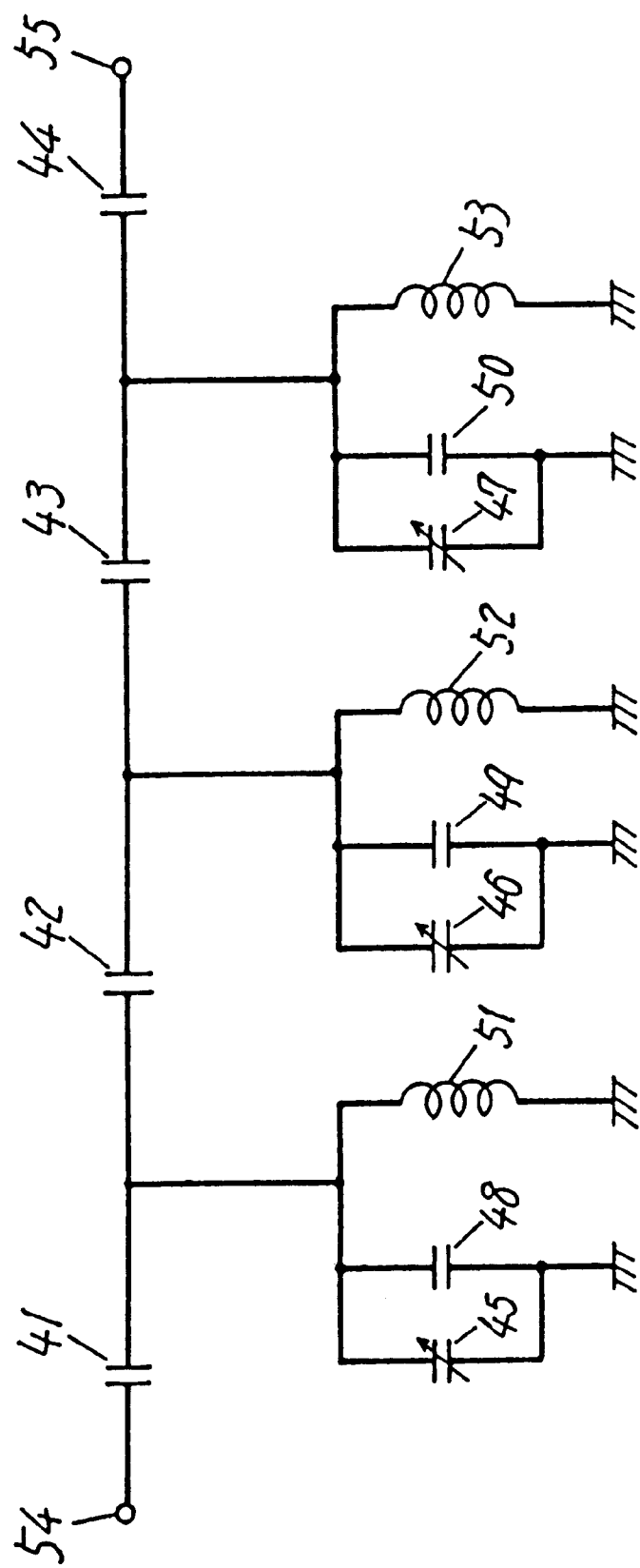
FIG. 11 is a schematic circuit diagram of a filter used in the foregoing amplifier.

FIG. 11 is a typical schematic circuit diagram of a frequency variable filter, wherein the reference numerals 41 to 44 are interstage coupling capacitors, the reference numerals 45 to 47 are varactor diodes, the reference numerals 48 to 50 are resonance capacitors, the reference numerals 51 to 53 are resonance coils, the reference numeral 54 is an input terminal and the reference numeral 55 is an output terminal.

Transmission signals are inputted into the input terminal 54 and outputted from the output terminal 55 after being attenuated according to frequency characteristics like the ones as described in FIG. 10, for example. In this case, the filter's frequency characteristics are determined according to a resonant frequency fixed by the resonance capacitor 48 and resonance coil 51, a resonant frequency fixed by the resonance capacitor 49 and resonant coil 52, a resonant frequency fixed by the resonance capacitor 50 and resonance coil 53 and the interstage coupling capacitors. When capacitance of the varactor diode 45 is changed, the total capacitance value of the foregoing capacitance and the capacitance of the resonance capacitor 48 is changed, resulting in a change of the resonant frequency that is determined by the foregoing total capacitance and the resonance coil 51. The varactor diodes 46 and 47 play the roles similar to the one played by the varactor diode 45. Accordingly, by changing the capacitance of the varactor diodes 45 to 47, the characteristics of the frequency variable filter can be changed as described in FIG. 10.

Although the present exemplary embodiment has dealt with a case wherein a resonator section was formed of resonance capacitors and resonance coils, the same effects can be achieved by the use of planar type resonators.

Figure 12:
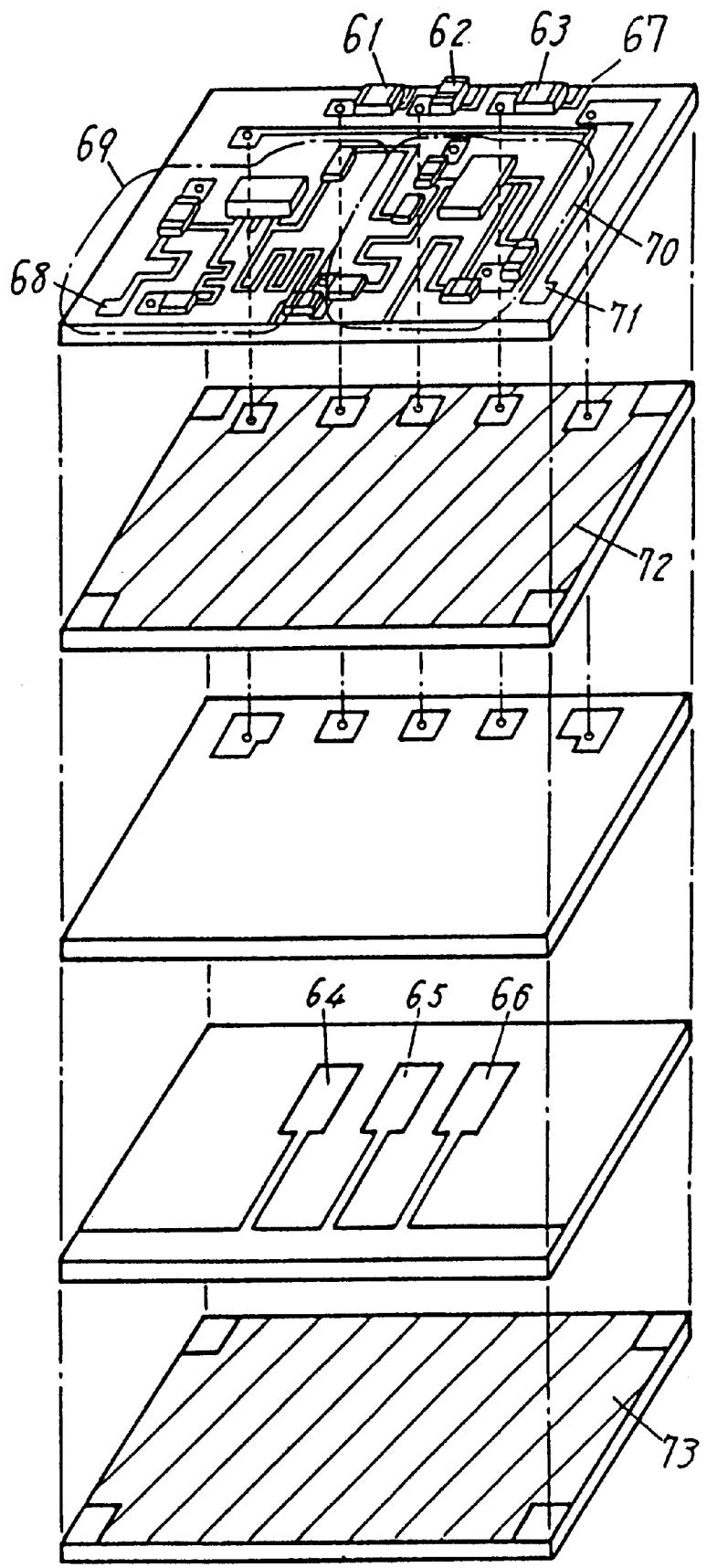
FIG. 12 shows how a band-pass amplifier with the foregoing filter built within a substrate is structured.

FIG. 12 shows a specific structure in another exemplary embodiment of the present invention, wherein the reference numerals 61 to 63 are varactor diodes, the reference numerals 64 to 66 are resonators, the reference numeral 67 is a control signal input terminal, the reference numeral 68 is an input terminal, the reference numerals 69 and 70 are amplification circuits, the reference numeral 71 is an output terminal and the reference numerals 72 and 73 are shields.

Transmission signals are inputted through the input terminal 68 and amplified by the amplification circuits 69 and 70. Then, the amplified transmission signals are attenuated at a frequency variable filter section formed of the varactor diodes 61 to 63, resonators 64 to 66 and the control signal input terminal 67 in accordance with frequency characteristics as described in FIG. 10, for example, and outputted from the output terminal 71. The varactor diode 61 has a role to change the resonant frequency of the resonator 64, the varactor diode 62 has a role to change the resonant frequency of the resonator 65 and the varactor diode 63 has a role to change the resonant frequency of the resonator 66. Input control signals inputted through the control signal input terminal 67 change the capacitance of the varactors 61 to 63 and cause the resonant frequencies of the resonators 64 to 66 to change, thereby having the frequency characteristics of the frequency variable filter changed.

Figure 13:
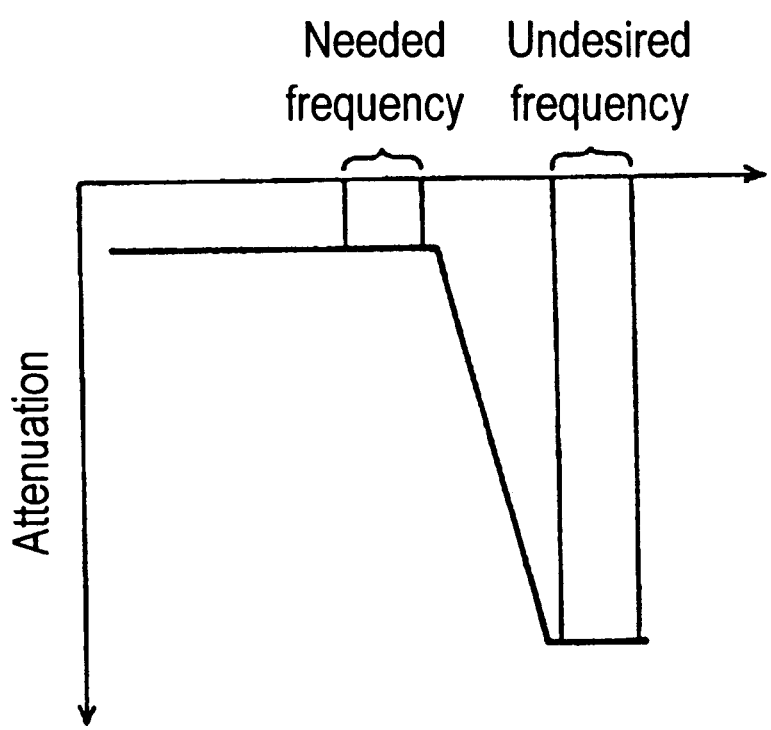
FIG. 13 shows frequency characteristics of a band eliminating filter used in a band-pass amplifier of the present invention.
Figure 14:
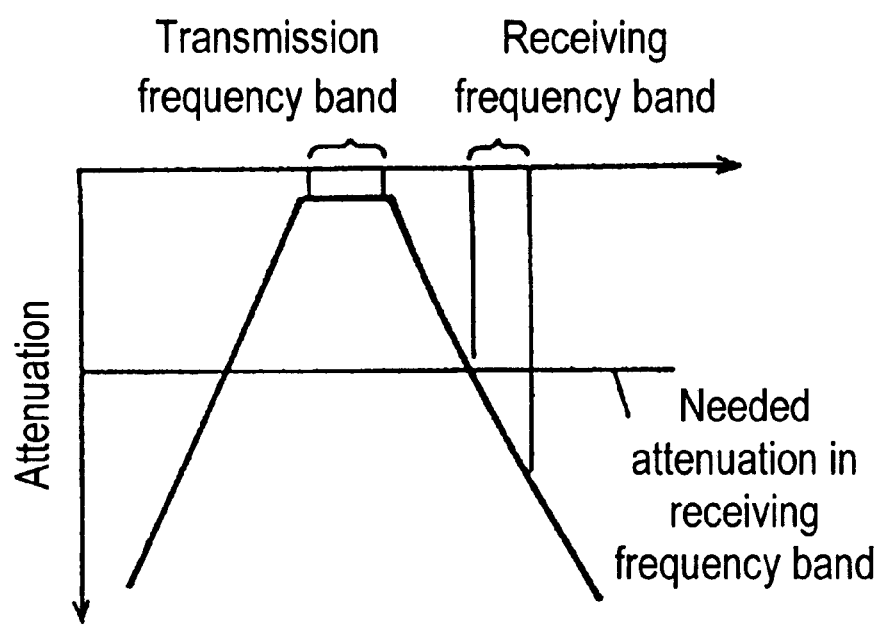
FIG. 14 shows frequency characteristics of a bandpass filter used in a prior art band-pass amplifier.

Although the present exemplary embodiment has dealt with a case wherein a band-pass filter was used, the same effects can be obtained by the use of a band rejection filter as shown in FIG. 13.

In addition, although the present exemplary embodiment has dealt with a case wherein a transmission amplifier for portable telephones was used, the same effects can be obtained by the use of the technologies of the present invention in transmission amplifiers in the equipment for communications and broadcasting used in the base stations of portable telephones, satellite communications and the like.

INDUSTRIAL APPLICATIONS

As described in the above, the present invention is characterized by connecting a first filter between the output section of a first amplification circuit of an amplifier and the input section of a second amplification circuit of the amplifier. Accordingly, the desired signals outputted from the first amplification circuit are hardly attenuated in the first filter and inputted into the second amplification circuit, but noises outputted from the first amplification circuit are attenuated in the first filter and inputted into the second amplification circuit. Therefore, only a very small amount of noises is outputted from the second amplification circuit.

According to the present invention as described in the foregoing, since a frequency variable filter wherein frequency characteristics are changed in accordance with passing signals is connected to the output side of an amplifier, the attenuation characteristics can be made less steep and the attenuation magnitude can be made small, thereby enabling to increase the overall efficiencies of the amplifier including the filter. In addition, since the control of the frequency characteristics of the frequency variable filter is performed by utilizing frequency control voltages of a voltage controlled oscillator, a downsizing of the amplifier is made possible. Moreover, by having the frequency variable filter built inside of the substrate of the amplifier, a further downsizing of the amplifier is made possible when compared with a case wherein the amplifier and filter are produced separately. Also, by the use of a different type of substrate, the dielectric constant of the frequency variable filter section can be increased, thereby enabling to downsize the amplifier further.

What is claimed is:

1. An amplifier having a first filter, which has a desired pass-band and a desired attenuation band and also has a difference between input impedance and output impedance by adjusting the input impedance to a value between ½ to 2 times the real part of output impedance of a first transistor and the output impedance to a value between ½ to 2 times the real part of input impedance of a second transistor, directly connected between the output terminal of the first transistor and the input terminal of the second transistor, wherein the first filter is formed so as to have electrode patterns built in a dielectric of a relative dielectric constant exceeding 10 inclusive that is sandwiched between ground electrodes on the upper and bottom surfaces thereof, electrode patterns are formed over said ground electrode on the upper surface of said dielectric with a dielectric material of a relative dielectric constant not exceeding 10 placed in between and a first amplification circuit and a second amplification circuit are mounted on said electrode patterns.

2. An amplifier having a first filter, which has a desired pass-band and a desired attenuation band and also has a difference between input impedance and output impedance by adjusting the input impedance to a value between ½ to 2 times the real part of output impedance of a first transistor and the output impedance to a value between ½ to 2 times the real part of input impedance of a second transistor, directly connected between the output terminal of the first transistor and the input terminal of the second transistor, wherein the first filter is formed so as to have electrode patterns built in a dielectric of a relative dielectric constant exceeding 10 inclusive that is sandwiched between ground electrodes on the upper and bottom surfaces thereof, electrode patterns are formed over said ground electrode on the upper surface of the dielectric with a dielectric material of a relative dielectric constant not exceeding 10 placed in between, a first amplification circuit and a second amplification circuit are mounted on said electrode patterns and also a part of terminal electrodes is formed over said ground electrode on the bottom surface of said dielectric with a dielectric material of a relative dielectric constant not exceeding 10 placed in between.

3. An amplifier having a first filter, which has a desired pass-band and a desired attenuation band and also has a difference between input impedance and output impedance by adjusting the input impedance to a value between ½ to 2 times the real part of output impedance of a first transistor and the output impedance to a value between ½ to 2 times the real part of input impedance of a second transistor, directly connected between the output terminal of the first transistor and the input terminal of the second transistor;

wherein the first filter is formed so as to have electrode patterns built in a dielectric sandwiched between ground electrodes on the upper and bottom surfaces thereof, wherein the first filter and amplification circuits are coupled by capacitance formed between opposing electrodes that have a dielectric material placed in between.

4. The amplifier according to claim 3, wherein the respective first and second transistors are mounted in recesses formed on the surface of the dielectric material.

5. The amplifier according to claim 3, wherein an electrode pattern connected with the ground terminals of the respective first and second transistors is connected to the upper and bottom ground electrodes by means of through holes.

6. The amplifier according to claim 3, wherein a directional coupler formed of electrode patterns is provided inside of a dielectric of a relative dielectric constant exceeding 10 inclusive or on the surface of a dielectric of a relative dielectric constant not exceeding 10.

7. The amplifier according to claim 4, wherein the dielectric materials of a relative dielectric constant not exceeding 10 that are used on the upper surface of the upper side ground electrode and on the bottom surface of the bottom side ground electrode are made of the same material and also made the same in thickness.

8. An amplifier having a first filter, which has a desired pass-band and a desired attenuation band and also has a difference between input impedance and output impedance by adjusting the input impedance to a value between ½ to 2 times the real part of the output impedance of a first transistor and the output impedance to a value between ½ to 2 times the real part of the input impedance of a second transistor, directly connected between the output terminal of the first transistor and the input terminal of the second transistor, and further having a second filter, which has the same desired pass-band and desired attenuation band as said first filter has and also has a difference between input impedance and output impedance by adjusting the input impedance to a value between ½ to 2 times the real part of the output impedance of the second transistor, directly connected to the output terminal of said second transistor, wherein the respective first and second filters are formed so as to have electrode patterns built in a dielectric of a relative dielectric constant exceeding 10 inclusive that is sandwiched between ground electrodes on the upper and bottom surfaces thereof, electrode patterns are formed over said ground electrode on the upper surface of said dielectric with a dielectric material of a relative dielectric constant not exceeding 10 placed in between and the first amplification circuit and second amplification circuit are mounted on the electrode patterns.

9. An amplifier having a first filter, which has a desired pass-band and a desired attenuation band and also has a difference between input impedance and output impedance by adjusting the input impedance to a value between ½ to 2 times the real part of output impedance of a first transistor and the output impedance to a value between ½ to 2 times the real part of input impedance of a second transistor, directly connected between the output terminal of the first transistor and the input terminal of the second transistor, wherein the respective first and second filters are formed so as to have electrode patterns built in a dielectric of a relative dielectric constant exceeding 10 inclusive that is sandwiched between ground electrodes on the upper and bottom surfaces thereof, electrode patterns are formed over said ground electrode on the upper surface of said dielectric with a dielectric material of a relative dielectric constant not exceeding 10 placed in between, the first amplification circuit and second amplification circuit are mounted on said electrode patterns and also a part of terminal electrodes is formed over said ground electrode on the bottom surface of said dielectric with a dielectric material of a relative dielectric constant not exceeding 10 placed in between.

10. An amplifier having a first filter, which has a desired pass-band and a desired attenuation band and also has a difference between input impedance and output impedance by adjusting the input impedance to a value between ½ to 2 times the real part of output impedance of a first transistor and the output impedance to a value between ½ to 2 times the real part of input impedance of a second transistor, directly connected between the output terminal of the first transistor and the input terminal of the second transistor, wherein the respective first filter and second filter are formed so as to have electrode patterns built in a dielectric sandwiched between ground electrodes on the upper and bottom surfaces thereof, wherein the respective first and second filters and amplification circuits are coupled by capacitance formed between opposing electrodes with a dielectric material placed in between.

11. The amplifier according to claim 8, wherein the respective first and second transistors are mounted in recesses formed on the surface of the dielectric material.

12. The amplifier according to claim 8, wherein an electrode pattern connected with the ground terminals of the respective first and second transistors is connected to the upper and bottom ground electrodes by means of through holes.

13. The amplifier according to claim 8, wherein a directional coupler formed of electrode patterns is provided inside of a dielectric of a relative dielectric constant exceeding 10 inclusive or on the surface of a dielectric of a relative dielectric constant not exceeding 10.

14. An amplifier having a first filter, which has a desired pass-band and a desired attenuation band and also has a difference between input impedance and output impedance by adjusting the input impedance to a value between ½ to 2 times the real part of output impedance of a first transistor and the output impedance to a value between ½ to 2 times the real part of input impedance of a second transistor, directly connected between the output terminal of the first transistor and the input terminal of the second transistor, wherein the respective first filter and second filter are formed so as to have electrode patterns built in a dielectric sandwiched between ground electrodes on the upper and bottom surfaces thereof, wherein a plurality of through holes or via holes connected to the upper side ground electrode and bottom side ground electrode are provided between the first filter and the second filter.

15. An amplifier having a first filter, which has a desired pass-band and a desired attenuation band and also has a difference between input impedance and output impedance by adjusting the input impedance to a value between ½ to 2 times the real part of output impedance of a first transistor and the output impedance to a value between ½ to 2 times the real part of input impedance of a second transistor, directly connected between the output terminal of the first transistor and the input terminal of the second transistor, wherein the respective first filter and second filter are formed so as to have electrode patterns built in a dielectric sandwiched between ground electrodes on the upper and bottom surfaces thereof, wherein the first filter and second filter are formed of strip lines and the strip lines of the first filter are arranged to be perpendicular to the strip lines of the second filter in direction.

16. The amplifier according to claim 8, wherein the respective first and second filters are used as a band-pass filter, a transmission band of communication equipment is the passing band of said band-pass filter and a receiving band of communication equipment is the attenuation band of said band-pass filter.

17. The amplifier according to claim 13, wherein the spacing between the through holes or via holes connected to the upper side and bottom side ground electrodes is made smaller than the length of strip lines of the first and second filters.

18. An amplifier having a first frequency variable filter, which has a desired pass-band and a desired attenuation band and has a difference between input impedance and output impedance by adjusting the input impedance to a value between ½ to 2 times the real part of the output impedance of a first transistor and also by adjusting the output impedance of a first filter to a value between ½ to 2 times the real part of the input impedance of a second transistor directly connected between the output terminal of the first transistor and the input terminal of the second transistor and having a frequency control voltage of a voltage controlled oscillator used as the control voltage of said frequency variable filter;

wherein a computing circuit to compute a control voltage for the first frequency variable filter in accordance with a frequency control voltage of the voltage controlled oscillator is connected between the voltage controlled oscillator and the control voltage application terminal of the first frequency variable filter.

19. The amplifier according to claim 18, wherein the first frequency variable filter is used as a band-pass filter, a transmission band of communication equipment is the passing band of said band-pass filter and a receiving band of communication equipment is the attenuation band of said band-pass filter.

20. The amplifier according to claim 18, wherein the first frequency variable filter is used as a band rejection filter and a receiving band of communication equipment is the rejection band of said band rejection filter.

21. The amplifier according to claim 18, wherein varactor diodes are used as the impedance variable elements of the first frequency variable filter.

22. An amplifier having a first frequency variable filter, which has a desired pass-band and a desired attenuation band and has a difference between input impedance and output impedance by adjusting the input impedance to a value between ½ to 2 times the real part of the output impedance of a first transistor and also by adjusting the output impedance of a first filler to a value between ½ to 2 times the real part of the input impedance of a second transistor, directly connected between the output terminal of the first transistor and the input terminal of the second transistor and having a frequency control voltage of a voltage controlled oscillator used as the control voltage of said frequency variable filter, wherein resonators of the first frequency variable filter are formed inside of a multilayered substrate and a circuit section of the frequency variable filter and an amplification circuit are formed on the surface of the substrate, thereby integrating the whole assembly in one-piece.

23. The amplifier according to claim 1, wherein the multilayered substrate is formed of a plurality of layers, each having properties different from one another.

24. An amplifier having a first frequency variable filter, which has a desired pass-band and a desired attenuation band and has a difference between input impedance and output impedance by adjusting the input impedance to a value between ½ to 2 times the real part of the output impedance of a first transistor and also by adjusting the output impedance of a first filter to a value between ½ to 2 times the real part of the input impedance of a second transistor, directly connected between the output terminal of the first transistor and the input terminal of the second transistor and further having a second frequency variable filter, which has the same desired pass-band and desired attenuation band as said first frequency variable filter has and has a difference between input impedance and output impedance by adjusting the input impedance to a value between ½ to 2 times the real part of the output impedance of a second transistor, directly connected to the output terminal of the second transistor and having a frequency control voltage of a voltage controlled oscillator used as the control voltage of said first and second frequency variable filters;

wherein a computing circuit to compute a control voltage for the first and second-frequency variable filters in accordance with a frequency control voltage of the voltage controlled oscillator is connected between the voltage controlled oscillator and the control voltage application terminal of the respective first and second frequency variable filters.

25. The amplifier according to claim 24, wherein the respective first and second frequency variable filters are used as a band-pass filter, a transmission band of communication equipment is the passing band of said band-pass filters and a receiving band of communication equipment is the attenuation band of said band-pass filters.

26. The amplifier according to claim 24, wherein the second frequency variable filter is used as a band rejection filter and a receiving band of communication equipment is the rejection band of said band rejection filter.

27. The amplifier according to claim 24, wherein varactor diodes are used as the impedance variable elements of the first and second frequency variable filters.

28. An amplifier having a first frequency variable filter, which has a desired pass-band and a desired attenuation band and has a difference between input impedance and output impedance by adjusting the input impedance to a value between ½ to 2 times the real part of the output impedance of a first transistor and also by adjusting the output impedance of a first filter to a value between ½ to 2 times the real part of the input impedance of a second transistor, directly connected between the output terminal of the first transistor and the input terminal of the second transistor and further having a second frequency variable filter, which has the same desired pass-band and desired attenuation band as said first frequency variable filter has and has a difference between input impedance and output impedance by adjusting the input impedance to a value between ½ to 2 times the real part of the output impedance of a second transistor, directly connected to the output terminal of the second transistor and having a frequency control voltage of a voltage controlled oscillator used as the control voltage of said first and second frequency variable filters, wherein resonators of the first and second frequency variable filters are formed inside of a multilayered substrate and a circuit section of the respective first and second frequency variable filters and an amplification circuit are formed on the surface of the substrate, thereby integrating the whole assembly in one-piece.

29. The amplifier according to claim 21, wherein the multilayered substrate is formed of a plurality of layers, each having properties different from one another.

* * * * *